United States Patent [19]

Betker et al.

[11] Patent Number: 4,736,157

[45] Date of Patent: Apr. 5, 1988

[54] WIDE-RANGE RESISTANCE MONITORING APPARATUS AND METHOD

[75] Inventors: Michael R. Betker; Robert H. Dunphy, both of Holland, Pa.

[73] Assignee: Voyager Technologies, Inc., Langhorne, Pa.

[21] Appl. No.: 886,885

[22] Filed: Jul. 18, 1986

[51] Int. Cl.[4] .................. G01R 19/165; G01R 27/14; G08B 21/00

[52] U.S. Cl. ..................... 324/62; 324/511; 324/133; 340/664; 340/661; 128/734

[58] Field of Search .............. 324/133, 62, 64, 65 R, 324/433, 509, 510, 511, 525, 555, 556; 361/90; 340/649, 650, 660–664, 636; 128/734

[56] References Cited

U.S. PATENT DOCUMENTS

| | | | |
|---|---|---|---|
| 3,772,593 | 11/1973 | Sidhu | 324/62 |
| 3,784,906 | 1/1974 | Ironside | 324/62 |
| 4,020,414 | 4/1977 | Paredes | 324/133 X |
| 4,417,202 | 11/1983 | Pascoe | 324/509 |
| 4,594,542 | 6/1986 | Fish | 340/660 X |

Primary Examiner—Reinhard J. Eisenzopf
Assistant Examiner—Jack B. Harvey
Attorney, Agent, or Firm—Nixon & Vanderhye

[57] ABSTRACT

An inexpensive circuit monitors the resistance between a body (e.g., a static dissipative work surface, a tool, etc.) and ground potential, and compares that resistance with high and low resistance values defining a preset resistance range. An operational amplifier is connected to the body and causes current to flow from the body and through the op amp feedback network. A switching arrangement coupled to the operational amplifier alternately switches the amplifier feedback network between low and high resistance values defining lower and upper ends, respectively, of the preset resistance range. A logic circuit connected to receive the op amp output (a) lights a green indicator lamp if the resistance under test falls within the preset resistance range, (b) lights red and green lamps alternately and pulses a buzzer if a measured resistance falls below the lower limit of the resistance range, and (c) lights yellow and green lamps alternately and pulses the buzzer if the measured resistance exceeds the upper level of the resistance range. The resistance range can be relatively large, spanning five orders of magnitude of resistance or more. The circuit is particularly useful for preventing static discharges from destroying CMOS and MOSFET electronic devices.

11 Claims, 1 Drawing Sheet

WIDE-RANGE RESISTANCE MONITORING APPARATUS AND METHOD

FIELD OF THE INVENTION

The present invention is related to monitoring the resistance between two bodies, and more particularly, to electrical circuits for checking the resistance between a body (for example, a person or tool) to ground.

BACKGROUND OF THE INVENTION

Most types of modern electronic components (e.g., metal oxide semiconductor field effect transistors—MOSFETs) are susceptible to damage due to static electrical discharge. The gate-source breakdown in MOSFET occurs at about 100 volts, but due to the very high input impedance between gate and source (about one T-ohm), even a low-energy source such as static discharge can cause the MOSFET breakdown voltage to be exceeded.

When a MOSFET suffers breakdown, its gate oxide layer is permanently shorted, rendering the device useless. Gate protection devices are therefore incorporated in almost all MOSFET integrated circuits to prevent gate-oxide breakdown. Such protective circuits significantly reduce the input impedance of the gate prior to actual gate breakdown, making the device more resistant to destruction, especially once the device is installed in a circuit. Nevertheless, precautions must be taken. when installing and/or testing MOSFET devices to ensure against dangerous static electric discharge.

One common technique for avoiding static electric discharge is to electrically connect all objects which may come into close proximity to MOSFET devices to ground potential through resistances which are significantly less than the MOSFET input resistance. Since MOSFET devices may themselves hold a static electric charge, it is undesirable to connect such objects directly to ground potential—since this would actually encourage static electrical discharges. Instead, all persons, tools, and work surfaces which may come into proximity with the sensitive MOSFET devices are typically connected to ground potential through leads having a resistance somewhere between $10^6$ and $10^{10}$ ohms. Such relatively large resistances are high enough to prevent static electric "sparks" from being generated, and yet are low enough compared with the input impedance of a MOSFET to gradually and safely discharge any built-up static electric charge to ground potential.

Therefore, a person should attach a "wrist strap" around his wrist before handling MOSFET devices, and connect the wrist strap to ground potential through a high-resistance lead. Any static electric charge which might tend to build up on the person is slowly discharged to ground through the wrist strap and lead (rather than rapidly discharging via an air gap to another surface)—and likewise, static charges which have built up on other bodies are prevented from discharging rapidly to the person because of the relatively high resistance between the person and ground.

Similarly, all work with MOSFET devices is desirably performed on a conventional static dissipative work surface electrically connected to ground potential. Finally, all electrically conductive tools (such as needle-nose pliers, and the like) are electrically connected (through high-resistance leads) to ground potential, all in an effort to minimize static electric discharges between MOSFET devices and any other objects.

It would be desirable to continuously monitor the resistance of, for example, a dissipative work mat to ground potential so that faulty (or forgotten) ground connections can't cause destruction of expensive electrical components.

Simple testers which determine whether a body is shorted to ground potential and/or has an "infinite" resistance to ground are known. Unfortunately, resistances to ground which are acceptable for preventing rapid static discharges fall within a relatively large range between about $10^6$ ohms and $10^{10}$ ohms. A dissipative work surface having a resistance to ground which is less than on the order of 1 megohm can draw static electrical discharges from charged MOSFET devices. If such objects have a resistance to ground which is greater than about $10^{10}$ ohms, the objects may themselves hold static electric charges and cause spark discharges to MOSFET devices brought into proximity with them. Any resistance to ground which falls into the range between these two limits is acceptable.

Of course, resistance measuring devices with adjustable ranges are, in general, known. However, there is a great need for a relatively simple circuit which can automatically, continuously check the resistance between an object and ground potential, and can warn an operator whenever that resistance falls outside (either below or above) a predetermined resistance range—that range corresponding to the wide range of resistances acceptable for handling sensitive (e.g. MOSFET) devices.

SUMMARY OF THE INVENTION

The present invention continuously monitors the resistance of a body to ground and determines whether that resistance falls within a preset range of resistances. Comparison of the monitored resistance with this resistance range is accomplished using a switching technique and current measurement. By alternating comparisons between the low and high ends of the resistance range, it is possible to obtain operation over several orders of magnitude of resistance.

In accordance with one important feature of the invention, a signal processor having a first input connected to a first body and having a second input connected to a second body monitors the resistance between the first and second bodies. The signal processor senses whenever the resistance between the two bodies exceeds a reference resistance value, and sets the reference value alternately to a first value and to a second value. The signal processor produces an output signal whenever the reference value is set to the first value and the sensed resistance between the two bodies exceeds the reference value, and produces a further (or the same) output signal whenever the reference value is set to the second value and the sensed resistance between the two bodies does not exceed the reference value.

In accordance with another feature of the invention, a comparator electrically connected to first and second bodies induces current to flow between the two bodies and produces an output signal whenever the magnitude of the current flow exceeds a reference level. A switching device operatively connected to the comparator and connected to receive a periodic control signal alternates the reference level between first and second values in response to the control signal. An indicator connected to receive the output and control signals provides a first indication when the current flow is less than the first value and provides a second indication when the current flow exceeds the second value.

In accordance with yet another feature of the invention, an indication of monitored resistance is provided by first and second indicator lamps. The first indicator lamp is activated whenever the comparator output signal is not present and the control signal is present. The second indicator lamp is activated whenever the output signal is present and the control signal is not present.

A third indicator lamp may be provided which is activated whenever: (a) the output signal and control signal are both present, or (b) the output signal and control signal are both not present. An acoustical warning may be provided whenever either (a) the output signal is present and the control signal is not present, or (b) the output signal is not present and the control signal is present.

The present invention uses a unique switching test technique which allows for a wide dynamic range with a relatively simple circuit, making it practical to operate the invention over a resistance range of at least five orders of magnitude. In addition, the indications provided by the present invention are useful to provide information to a user and to warn the user when an inadequate grounding situation exists.

BRIEF DESCRIPTION OF THE DRAWINGS

These and other features and advantages of the present invention will be better and more completely understood by referring to the following detailed description of preferred embodiments in conjunction with the appended single sheet of drawings, of which.

DETAILED DESCRIPTION OF PREFERRED EMBODIMENTS

Figure 1:
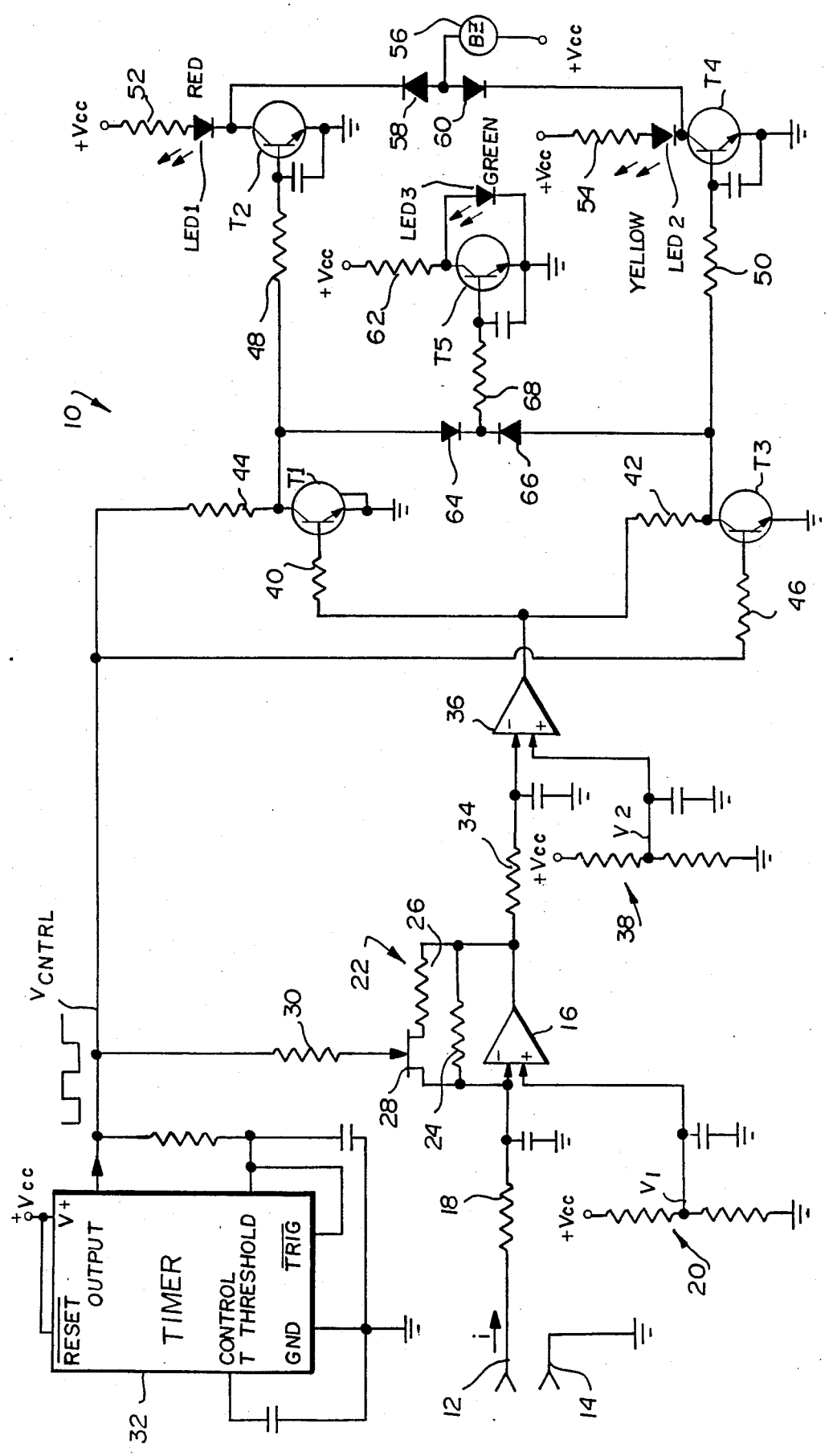
FIG. 1 is a schematic diagram of the presently preferred exemplary embodiment of a resistance monitoring circuit in accordance with the present invention.

FIG. 1 shows a schematic circuit diagram of the presently preferred exemplary embodiment of a resistance monitoring device 10 in accordance with the present invention. Monitor 10 continuously monitors the resistance between a first and a second body and is especially suited for monitoring the resistance of a first body (e.g., a person, a work surface, a tool, or the like) to ground potential (i.e., the earth itself may be the second body).

Monitor 10 compares the resistance of a body to ground potential with a range of resistances between approximately 750 kilohm and $10^{10}$ ohms (the resistance range for typical static dissipative work surfaces is from $10^6$ ohms to $10^{10}$ ohms). Monitor 10 measures this large resistance range using a switching technique and a current measurement. By alternating between the low and high ends of the desired resistance range, monitor 10 is capable of operating over the five or more orders of magnitude necessary for this type of measurement.

The body the resistance of which is to be measured is connected to input terminal 12 of monitor 10. The manner in which this connection is made depends on the nature of the body itself. Dissipative work surfaces may be provided with an electrical connection for grounding—and input terminal 12 can be connected to that terminal. If the resistance to ground of a tool is to be monitored, input terminal 12 should be connected to a portion of the tool which is electrically connected to all portions of the tool which may contact the electronic components being worked with. Input terminal 14 of monitor 10 is connected directly to a suitable earth ground (e.g., a copper post driven into the ground, a grounded electrical outlet terminal, or the like).

Input terminal 12 connects the body to the inverting differential input of an operational amplifier ("op amp") 16 through a series resistor 18 (having a 1 megohm value in the preferred embodiment). A reference voltage level $V_1$ (4.5 volts DC nominal in the preferred embodiment) as generated by a voltage divider 20 is applied to the non-inverting differential input of op amp 16. A feedback network 22 connects the output terminal of op amp 16 to its inverting input terminal.

Feedback network 22 causes the voltage existing at the inverting input of op amp 16 to be equal to the reference voltage applied to the op amp non-inverting input, thus inducing a current i to flow into (out of) the object connected to input terminal 12. The magnitude of the induced current i depends on the resistance between input terminal 12 and ground potential (i.e. the resistance to ground of the body connected to input terminal 12) and the reference voltage $V_1$.

Since the input impedance of op amp 16 is on the order of $10^{12}$ ohms, the current i induced to flow through the body being monitored flows through feedback network 22, resulting in a potential difference across the feedback network. This potential difference is based on the reference voltage $V_1$ and the resistance between input terminal 12 and ground potential. This potential difference also depends upon the characteristics of feedback network 22.

Feedback network 22 includes a first resistor 24, a second resistor 26, and a field effect transistor (FET) 28. First resistor 24 (1000 megohms in the preferred embodiment) is connected directly between the output terminal of op amp 16 and the op amp inverting input terminal. One switching terminal of FET 28 is connected to the op amp inverting input, and the other switching terminal of the FET is connected to one end of second resistor 22 (180 kilohms in the preferred embodiment). The other end of resistor 22 is connected to the op amp output terminal.

The value of resistor 24 (and the level of $V_1$) sets the value of the upper limit of the resistance test range. The value of resistor 26 (and the level of $V_1$) sets the value of the lower limit of the resistance test range.

The gate of FET 28 is driven (through a suitable series resistor 30) by a periodic control signal $V_{cntrl}$. Control signal $V_{cntrl}$ is generated in the preferred embodiment by a conventional integrated circuit timer 32 (for example, an NE-555 timer) operated in its bistable mode of operation. Thus, control signal $V_{cntrl}$ is, in the preferred embodiment, a square wave signal which periodically varies between approximately 0 volts (logic level 0) and approximately 9 volts DC (logic level 1). The frequency of control signal $V_{cntrl}$ is approximately 2 Hertz in the preferred embodiment (although any relatively low frequency could be used).

FET 28 is turned ON when control signal $V_{cntrl}$ is at logic level 1, causing resistor 26 to be connected in parallel with resistor 24. Because resistor 24 in the preferred embodiment has a resistance which is several orders of magnitude higher than the resistance of resistor 26, the effective resistance of feedback network 22 is determined by the resistance of resistor 26 when FET 28 is ON. Monitor 10 compares the resistance of the body connected to input terminal 12 to ground with the lower limit of the predetermined resistance range (750 kilohms) when FET 28 is ON.

When control signal $V_{cntrl}$ is at logic level 0, FET 28 is OFF and resistor 26 is disconnected from the inverting input of op amp 16. Thus, with FET 28 OFF, the resistance of feedback network 22 is a function of the resistance of resistor 24 (assuming the maximum leakage current through FET 28 is at least an order of magnitude less than test current i). When FET 28 is OFF and resistor 26 is disconnected from the op amp inverting input, the monitor 10 compares the resistance of input terminal 12 to ground with the upper limit of the predetermined resistance range ($10^{10}$ ohms in the preferred embodiment).

Op amp 16 produces a logic level 1 output signal at its output terminal whenever the current i exceeds the reference current determined by the characteristics of feedback network 22 and by reference voltage $V_1$. Op amp 16 (a TLC27L2ACP in the preferred embodiment) produces an output signal responsive to the relationship between the input test current i and a current reference level set by the characteristics of feedback network 22 and the level of reference voltage $V_1$.

Op amp 16 produces an output signal whenever the voltage drop across feedback network 22 exceeds reference voltage $V_1$ (i.e., the current i exceeds the current reference level)—and the level of the op amp output signal increases as current i increases. When FET 28 is OFF, even small currents i produce large voltage drops across feedback network 22 because of the high value of resistor 24. In contrast, a relatively large test current i is needed to produce an equal voltage drop across feedback network 22 when FET 28 is ON because of the relatively low value of resistor 26.

Hence, op amp 16 produces an analog output voltage level indicative of the relationship between the resistance being tested and a selected reference resistance value. The values of resistors 24 and 26 are selected so that the voltage produced at the output of op amp 16 are the same (4.95 volts nominal in the preferred embodiment) for upper and lower limits of the preset resistance test range. In this way, a single comparison voltage can be used—it is possible to simply compare the level of the output of op amp 16 with a single preset second reference level $V_2$ to determine whether the monitored resistance exceeds either of the predetermined reference resistances which are alternately selected by control signal $V_{cntrl}$ and FET 28.

The output terminal of op amp 16 is connected through a series resistor 34 to the inverting input of a comparator 36. A further reference voltage $V_2$ (nominally 4.95 volts DC in the preferred embodiment) produced by a voltage divider 38 is applied to the noninverting input of comparator 36. Op amp 36 compares the voltage level output of op amp 16 with second reference voltage $V_2$ and produces a logic level 1 output only when the output of op amp 16 exceeds $V_2$.

If FET 28 is OFF, op amp 36 produces a logic level 1 output only if the resistance between input terminals 12 and 14 exceeds the upper limit of the predetermined resistance range (approximately $10^{10}$ ohms in the preferred embodiment), and otherwise produces a logic level 0 signal. When FET 28 is ON, op amp 36 produces a logic level 1 signal only if the resistance between input terminals 12 and 14 is exceeds the lower limit of the resistance range (approximately 750 kilohms in the preferred embodiment), and otherwise produces a logic level 0 signal.

If the resistance of input terminals 12 and 14 is within the predetermined resistance range, op amp 36 produces a logic level 1 signal when control signal $V_{cntrl}$ is at logic level 1 (indicating the test resistance exceeds the lower limit of the range), and produces a logic level 0 signal whenever the control signal is at logic level 0 (indicating the test resistance is less than the upper limit of the range).

If comparator 36 produces a logic level 1 signal when $V_{cntrl}$ is OFF, the resistance between input terminals 12 and 14 exceeds the upper limit of the resistance range, and an error condition exists. Similarly, if comparator 36 does not produce an output signal (i.e., produces a logic level 0 output signal) when $V_{cntrl}$ is ON, the resistance between input terminals 12 and 14 is less than the lower limit of the preset resistance range, and a different error condition exists. The present invention provides a visual and aural indication of the three possible relationships between the resistance being monitored and the test resistance range.

The output terminal of comparator 36 is connected to the base of a NPN transistor T1 through a series resistor 40, and is also connected to the collector of a further NPN transistor T3 via a series resistor 42. The emitters of transistors T1 and T3 are each connected to ground potential. Control signal $V_{cntrl}$ is connected to the collector of transistor T1 through series resistor 44, and is connected to the base of transistor T3 through series resistor 46.

The collector of transistor T1 is connected to the base of an NPN transistor T2 through a series resistor 48. Likewise, the collector of transistor T3 is connected to the base of an NPN transistor T4 through a series resistor 50. The emitters of transistors T2 and T4 are connected to ground potential.

The cathode of a light emitting diode LED1 (red in color in the preferred embodiment) is connected to the collector of transistor T2. The anode of LED1 is connected the power supply voltage potential (9 volts DC in the preferred embodiment) through a current limiting resistor 52. A further light emitting diode LED2 (yellow in color in the preferred embodiment) is connected to the collector of transistor T4 at its cathode, and is connected to the power supply voltage through a further current limiting resistor 54 at its anode.

Table I below shows the states of transistors T1-T4, LED1 and LED2 in response to the four possible combinations of control signal $V_{cntrl}$ and the signal generated at the output of comparator 36:

TABLE I

| CNTRL SIGNAL | OUTPUT SIGNAL | T1 | T2 | LED1 | T3 | T4 | LED2 |
|---|---|---|---|---|---|---|---|
| 0 | 0 | OFF | OFF | OFF | OFF | OFF | OFF |
| 0 | 1 | ON | OFF | OFF | OFF | ON | ON |
| 1 | 0 | OFF | ON | ON | ON | OFF | OFF |
| 1 | 1 | ON | OFF | OFF | ON | OFF | OFF |

Thus, LED1 is ON only if control signal $v_{cntrl}$ is at logic level 1 and the output of comparator 36 is at logic level 0—indicating that the resistance under test is less than the lower level of the predetermined resistance range. LED2 is ON only if control signal $v_{cntrl}$ is at logic level 0 and comparator 36 generates an output signal (i.e., produces a logic level 1 output signal)—indicating that the resistance under test exceeds the upper limit of the predetermined resistance range.

A low-voltage acoustical source 56 (for example, a conventional low voltage electro-mechanical "buzzer" or piezo-electric transducer) generates a warning sound whenever either LED1 or LED2 is ON. One terminal of buzzer 56 is connected to power supply voltage, while the other terminal of the buzzer is connected to the anodes of diodes 58 and 60. The cathode of diode 58 is connected to the collector of transistor T2. Similarly, the cathode of diode 60 is connected to the collector of transistor T4. Buzzer 56 turns on whenever either transistor T2 is ON or transistor T4 is ON.

LED1 and/or LED2 are lit only if an error condition exists. An additional LED3 (green in color in the preferred embodiment) lights whenever the measured resistance is within the predetermined resistance range (thus indicating normal conditions exist).

The anode of LED3 is connected to the collector of a NPN transistor T5, and the cathode of LED3 is connected to ground potential (the emitter of transistor T5 is also connected to ground). The collector of transistor T5 is connected to the power supply voltage through series resistor 62. The base of transistor T5 is connected to cathodes of diodes 64 and 66 through a series resistor 68. The anode of diode 64 is connected to the collector of transistor T1, and the anode of diode 66 is connected to the collector of transistor T3.

Table II below shows the states of transistors T1, T3 and T5 and the resulting state of LED3 in response to the four combinations of levels of control signal $V_{cntrl}$ and the signal generated at the output of comparator 36:

TABLE II

| CNTRL SIGNAL | OUTPUT SIGNAL | T1 | T3 | T5 | LED3 |
|---|---|---|---|---|---|
| 0 | 0 | OFF | OFF | OFF | ON |
| 0 | 1 | ON | OFF | ON | OFF |
| 1 | 0 | OFF | ON | ON | OFF |
| 1 | 1 | ON | ON | OFF | ON |

Thus, LED3 is activated only if the control signal and the output signal have the same values (either both logic level 0 or both logic level 1).

If the resistance between input terminals 12 and 14 of monitor 10 is below the lower limit of the resistance range, LED1 and LED3 are alternately illuminated at the frequency of control signal $V_{cntrl}$, and buzzer 56 sounds whenever LED1 is illuminated. If the resistance between input terminals 12 and 14 exceeds the upper limit of the resistance range, LED3 and LED2 are alternately illuminated at the frequency of the control signal, and buzzer 56 sounds when LED2 is on. If the monitored resistance falls within the test range, LED3 lights continuously. Resistor-capacitor networks in the base junctions of transistors T2, T4, and T5 prevent LED3 from turning off and LED1 and LED2 from coming on while the control signal change levels.

The alternating of the light emitting diode indicators and the sound generated by buzzer 56 provides a unique and unmistakable indication which can be easily differentiated from other alarm indications and sounds. The indication provided by monitor 10 is also extremely useful in determining what sort of grounding fault exists. If LED1 is illuminated, the resistance to ground of the object being monitored is so low that it may draw static electric discharge, and corrective action should be taken immediately. If LED2 lights, there is a very high resistance between the body being monitored and ground potential (such as might be caused by a broken grounding strap or the like). Constant illumination of LED3 is a positive indication that the resistance being tested is within an acceptable range, and that no danger of undesirable static discharge exists.

An inexpensive, relatively simple circuit for monitoring resistance of a body to ground potential has been disclosed. While the present invention has been described with what is presently considered to be the most practical and preferred embodiments, it is to be understood that the appended claims are not to be limited to the disclosed embodiments, but, on the contrary, are intended to cover modifications, variations, and/or equivalent arrangements which retain any of the novel features and advantages of this invention.

By way of non-limiting example, the present invention might be used to determine the resistance between two bodies each of which are isolated from ground potential. Although the invention is designed to produce visual and/or audio indications, the light emitting diodes and/or buzzer which have been disclosed could be omitted and monitor 10 used to generate logic level control signal inputs to a minicomputer or other digital signal processor. In addition, some or all of the specific circuitry shown in FIG. 1 could be replaced with equivalent arrangements (such as digital logic gates, a microprocessor, or the like) which perform equivalent functions.

What is claimed is:

1. Apparatus for monitoring the resistance between first and second bodies, comprising:
    comparing means, electrically connected to said first and second bodies, for inducing current to flow between said first and second bodies and for producing an output signal whenever the magnitude of said current flow exceeds a reference level;
    swithching means, operatively connected to said comparing means and connected to receive a periodic control signal, for alternating said reference level between first and second values in response to said control signal; and
    indicator means, connected to receive said output and control signals, for providing a first indication when said current flow is less than said first value and for providing a second indication when said current flow exceeds said second value, wherein:
    said comparing means comprises:
        operational amplifier means having first and second input terminals and an output terminal for producing an output signal at its output terminal whenever the signal level present on its first input terminal exceeds the signal level present on its second input terminal,
        a resistive element electrically connected between said first body and said operational amplifier first input terminal, and
        reference voltage level producing means, having a first terminal connected to said second body and a second terminal connected to said operational amplifier second input terminal, for producing a fixed reference voltage across said first and second terminals; and
    said switching means comprises:
        a first resistor connected between said operational amplifier first input and output terminals,
        a second resistor having a first end connected to one of said operational amplifier output terminal and said operational amplifier first input terminal, said resistor having a further end, and a switching element having a control terminal and first and second switching terminals, said control terminal being connected to receive said control signal, said first switching terminal being connected to said second resistor further end, said second switching terminal being connected to the other one of said operational amplifier output terminal and said operational amplifier first input terminal.

2. Apparatus as in claim 1 wherein:

said switching means sets said reference level to said first value when said control signal is present and sets said reference level to said second value when said control signal is not present, said first reference value being less than said second reference value; and said indicator means comprises:
a first indicator lamp,
a second indicator lamp,
means, operatively connected to said first indicator lamp and connected to receive said control signal and said output signal, for activating said first indicator lamp whenever said output signal is not present and said control signal is present, and
means, operatively connected to said second indicator lamp and connected to receive said control signal and said output signal, for activating said second indicator lamp whenever said output signal is present and said control signal is not present.

3. Apparatus as in claim 2 wherein said indicator means further includes:
a third indicator lamp; and
means, operatively connected to said third indicator lamp and connected to receive said control signal and said output signal, for activating said third indicator lamp whenever (a) said output signal and said control signal are both present, or (b) said output signal and control signal are both not present.

4. Apparatus as in claim 1 wherein said indicator means includes:
a first transistor having a base, an emitter and a collector, said emitter being connected to ground potential, said base connected to receive said output signal, said collector being connected to receive said control signal;
a second transistor having a base, an emitter and a collector, said emitter being connected to ground potential, said base being connected to said first transistor collector; and
a first light emitting diode being connected between a supply voltage and said second transistor collector.

5. Apparatus for monitoring the resistance between first and second bodies, comprising:
comparing means, electrically connected to said first and second bodies, for inducing current to flow between said first and second bodies and for producing an output signal whenever the magnitude of said current flow exceeds a reference level;
switching means, operatively connected to said comparing means and connected to receive a periodic control signal, for alternating said reference level between first and second values in response to said control signal; and indicator means, connected to receive said output and control signals, for providing a first indication when said current flow is less than said first value and for providing a second indication when said current flow exceeds said second value, said indicator means including:
a first transistor having a base, an emitter and a collector, said emitter being connected to ground potential, said base connected to receive said output signal, said collector being connected to receive said control signal;
a second transistor having a base, an emitter and a collector, said emitter being connected to ground potential, said base being connected to said first transistor collector; and
a first light emitting diode being connected between a supply voltage and said second transistor collector;
a third transistor having a base, an emitter and a collector, said emitter being connected to ground potential, said base being connected to receive said control signal, said collector being connected to receive said output signal;
a fourth transistor having a base, an emitter and a collector, said emitter being connected to ground potential, said base being connected to said third transistor collector; and
a third light emitting diode being connected between a supply voltage and said fourth transistor collector.

6. Apparatus for monitoring the resistance between first and second bodies, comprising:
comparing means, electrically connected to said first and second bodies, for inducing current to flow between said first and second bodies and for producing an output signal whenever the magnitude of said current flow exceeds a reference level;
switching means, operatively connected to said comparing means and connected to receive a periodic control signal, for alternating said reference level between first and second values in response to said control signal; and
indicator means, connected to receive said output and control signals, for providing a first indication when said current flow is less than said first value and for providing a second indication when said current flow exceeds said second value, wherein said indicator means includes:
a first transistor having a base, and emitter and a collector, said emitter being connected to ground potential, said base connected to receive said output signal, said collector being connected to receive said control signal;
a second transistor having a base, an emitter and a collector, said emitter being connected to ground potential, said base being connected to said first transistor collector; and
a first light emitting diode being connected between a supply voltage and said second transistor collector;
a further transistor having a base, an emitter and a collector, said emitter being connected to ground potential, said base being connected to the collectors of said first and third transistors, said collector being connected to said supply voltage; and
a further light emitting diode being connected between said further transistor collector and emitter.

7. Apparatus for monitoring the resistance between first and second bodies, comprising:

comparing means, electrically connected to said first and second bodies, for inducing current to flow between said first and second bodies and for producing an output signal whenever the magnitude of said current flow exceeds a reference level;

switching means, operatively connected to said comparing means and connected to receive a periodic control signal, for alternating said reference level between first and second values in response to said control signal; and indicator means, connected to receive said output and control signals, for providing a first indication when said current flow is less than said first value and for providing a second indication when said current flow exceeds said second value, wherein said indicator means includes:

a first transistor having a base, and emitter and a collector, said emitter being connected to ground potential, said base connected to receive said output signal, said collector being connected to receive said control signal;

a second transistor having a base, an emitter and a collector, said emitter being connected to ground potential, said base being connected to said first transistor collector; and a first light emitting diode being connected between a supply voltage and said second transistor collector;

a further transistor having a base, an emitter and a collector, said emitter being connected to ground potential, said base being connected to said first transistor collector, said collector being connected to said supply voltage; and a further light emitting diode being connected between said further transistor collector and emitter.

8. Apparatus as in claim 7 wherein said switching means alternately sets said reference level to correspond to a resistance between said first and second bodies of about 750 kilohms and a resistance between said first and second bodies of about $10^{10}$ ohms.

9. Apparatus for monitoring the resistance between first and second bodies, comprising:

comparing means, electrically connected to said first and second bodies, for inducing current to flow between said first and second bodies and for producing an output signal whenever the magnitude of said current to flow exceeds a reference level;

switching means, operatively connected to said comparing means and connected to receive a periodic control signal, for alternating said reference level between first and second values in response to said control signal; and indicator means, connected to receive said output and control signals, for providing a first indication when said current flow is less than said first value and for providing a second indication when said current flow exceeds said second value, wherein:

said switching means sets said reference level to said first value when said control signal is present and sets said reference level to said second value when said control signal is not present; and said indicator means includes:

means for producing an acoustical output in response to an electrical signal applied thereto; and means, connected to receive said control and output signals and electrically connected to said acoustical output producing means, for applying an electrical signal to said acoustic output producing means whenever either (a) said output signal is present and said control signal is not present, or (b) said output signal is not present and said control signal is present.

10. An apparatus for monitoring the electrical resistance between a body and ground potential, said apparatus comprising:

operational amplifier means having first and second input terminals and an output terminal for generating an output signal at its output terminal in response to the relative levels present on its first and second input terminals;

a resistive element electrically connected at one end to said body and electrically connected at its other end to said operational amplifier first input terminal;

means for applying a fixed reference level to said operational amplifier second input terminal;

switching means, operatively connected to said operational amplifier, for alternately connecting a first resistance and a second resistance between said operational amplifier output terminal and first input terminal; and indicating means, connected to said operational amplifier output terminal, for providing an indication in response to said operational amplifier output signal, said indicating means (a) providing a first indication whenever the resistance between said body and ground potential is less than a value set by said first resistance, (b) providing a second indication whenever the resistance between said body and ground potential is greater than a value set by said second resistance, and (a) providing a third indication whenever the resistance between said body and ground potential is between said first-mentioned and second-mentioned values.

11. An apparatus for monitoring the electrical resistance between a work surface and ground potential, said apparatus comprising:

a lead electrically connected at one end to said work surface and having another end;

operational amplifier means having first and second input terminals and an output terminal for generating an output signal at its output terminal in response to the relative levels present on its first and second input terminals, said first input terminal being electrically connected to the other end of said lead;

means for applying a fixed reference level to said operational amplifier second input terminal;

switching means, operatively connected to said operational amplifier, for alternately connecting a first resistance and a second resistance between said operational amplifier output terminal and first input terminal, said first and second resistances being a function of the upper and lower limits of a preset resistance range;

a further operational amplifier having first and second input terminals and an output terminal, said first input terminal being connected to the output terminal of said first-mentioned operational amplifier;

means for applying a further, fixed reference level to said further operational amplifier second input terminal; and indicating means, connected to said further operational amplifier output terminal, for providing an indication whenever the resistance between said work surface and ground potential is less than the lower limit of said preset resistance range, and whenever the resistance between said work surface and ground potential is greater than the upper limit of said preset resistance range.

* * * * *